US012639584B2

(12) United States Patent
Ameyugo

(10) Patent No.: US 12,639,584 B2
(45) Date of Patent: May 26, 2026

(54) LEARNING DEVICE FOR MOBILE CYBER-PHYSICAL SYSTEM

(71) Applicant: COMMISSARIAT A L'ENERGIE ATOMIQUE ET AUX ENERGIES ALTERNATIVES, Paris (FR)

(72) Inventor: Gregorio Ameyugo, Longpont-sur-Orge (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 586 days.

(21) Appl. No.: 18/037,544

(22) PCT Filed: Nov. 18, 2021

(86) PCT No.: PCT/EP2021/082153
§ 371 (c)(1),
(2) Date: May 17, 2023

(87) PCT Pub. No.: WO2022/106545
PCT Pub. Date: May 27, 2022

(65) Prior Publication Data
US 2023/0401453 A1      Dec. 14, 2023

(30) Foreign Application Priority Data
Nov. 23, 2020    (FR) ...................................... 2011987

(51) Int. Cl.
*G06N 5/02*        (2023.01)
*G06F 30/27*       (2020.01)
(52) U.S. Cl.
CPC ............... *G06N 5/02* (2013.01); *G06F 30/27* (2020.01)

(58) Field of Classification Search
CPC .......... G06N 5/02; G06N 3/0464; G06N 3/09; G06N 3/092; G06N 3/098; G06N 3/08; G06F 30/27
See application file for complete search history.

(56) References Cited

U.S. PATENT DOCUMENTS 10,481,044 B2 *  11/2019  Sun ................... B60W 50/0205
11,042,155 B2 *   6/2021  Zheng .................... G05D 1/227
(Continued)

FOREIGN PATENT DOCUMENTS

DE      10 2018 220 865 A1      6/2020
DE      10 2019 206 908 A1     11/2020
(Continued)

OTHER PUBLICATIONS

DE 112019001605 T (English Translation) (Year: 2020).*
(Continued)

*Primary Examiner* — Michael Jared Walker
(74) *Attorney, Agent, or Firm* — BakerHostetler

(57)        ABSTRACT

A learning device intended to be included in a mobile cyber-physical system provided with actuators, the device comprising at least one perception sensor for perceiving the external environment of the system, at least one internal sensor able to provide information concerning the state of the system, a first learning unit configured to render a perception of the environment from the data acquired by the at least one perception sensor, a second learning unit configured to control the actuators, a generator for generating simulation scenarios of the system in its environment controlled by the first learning unit and the second learning unit, a scenario simulator and a virtualization platform for simulating the behavior of a digital twin of the system in the scenarios simulated by the generator and for adapting the
(Continued)

parameters of the second learning unit in order to control the system so that it adapts to its environment.

11 Claims, 5 Drawing Sheets

(56) References Cited

U.S. PATENT DOCUMENTS

2018/0349785 A1\*  12/2018  Zheng .................... G05D 1/227
2021/0073345 A1\*   3/2021  St. Romain, II ........ G06F 30/20

FOREIGN PATENT DOCUMENTS

EP          3 152 097 A1     4/2017
EP          3 198 523 A1     8/2017
EP          3 384 462 A1    10/2018
FR          3 076 028 A1     6/2019
WO        2018/011497 A1     1/2018

OTHER PUBLICATIONS

DE 102018220865 B4 (English Translation) (Year: 2020).\*
Ke, et al., "IoT System for Real-Time Near-Crash Detection for Automated Vehicle Testing", Arxiv.org, Cornell University, 2020.
Hill, et al., "Neuroevolution with CMA-ES for real-time gain tuning of a car-like robot controller", proc. 16th Int. Conf. on Informatics in Control, Automation and Robotics, pp. 311-319, Jul. 2019.
Lucet, et al., "Dynamic path tracking control of a vehicle on slippery terrain", Control Engineering Practice, vol. 42, pp. 60-73, Sep. 2015.
Rahmouni, et al., "Robot trajectory generation for three-dimensional flexible load transfer", proc. 45th Annual Conf. of the IEEE Industrial Electronics Society, Oct. 2019.
Amini et al., "Learning Robust Control Policies for End-to-End Autonomous Driving From Data-Driven Simulation", IEEE Robotics and Automation Letters, vol. 5, No. 2, Apr. 2020.
Ribeiro, et al., "RIMOC, a feature to discriminate unstructured motions: Application to violence detection for video-surveillance", Computer Vision and Image Understanding, vol. 144, pp. 121-143, Mar. 2016.
Larnaout, et al., "Fast and automatic city-scale environment modelling using hard and/or weak constrained bundle adjustments", Machine Vision and Applications, vol. 27, No. 6, pp. 943-962, Aug. 2016.
Vaquette, et al., "Robust information fusion in the DOHT paradigm for real time action detection", Journal of Real-Time Image Processing, Oct. 2019.
Chesnais, et al., "A Region Driven and Contextualized Pedestrian Detector", proc. 8th Int. Conf. on Computer Vision Theory and Application, pp. 796-799, Feb. 21-24, 2013.
Chabot, et al., "Deep Manta: A Coarse-to-fine Many-Task Network for joint 2D and 3D vehicle analysis from monocular image", proc. IEEE Conf. on Computer Vision and Pattern Recognition, Jul. 2017.
Krause, et al., "A hierarchical approach for generating descriptive image paragraphs", Proceedings of the IEEE Conference on Computer Vision and Pattern Recognition (CVPR), pp. 317-325, 2017.
Bagschik, et al., "Ontology based scene creation for the development of automated vehicles", 2018 IEEE Intelligent Vehicles Symposium (IV), 2018.

\* cited by examiner

LEARNING DEVICE FOR MOBILE CYBER-PHYSICAL SYSTEM

CROSS-REFERENCE TO RELATED APPLICATIONS

This application is a National Stage of International patent application PCT/EP2021/082153, filed on Nov. 18, 2021, which claims priority to foreign French patent application No. FR 2011987, filed on Nov. 23, 2020, the disclosures of which are incorporated by reference in their entirety.

FIELD OF THE INVENTION

The invention relates to the field of distributed learning systems, in particular mobile cyber-physical systems comprising learning artificial intelligence able to control the movement and the evolution of such systems in their environment or, more generally, the interaction of these systems with their environment.

The invention notably applies to the field of autonomous vehicles, but also to the field of robotics or drones.

BACKGROUND

A general problem in the field of autonomous systems relates to the automatic control of such systems moving and interacting with their environment.

More specifically, the autonomous systems use machine learning algorithms in order to learn to recognize the obstacles in their environment and to determine the best possible trajectories.

These algorithms typically operate according to two phases: a learning phase, during which the parameters of the algorithm are determined from acquired learning data, and an operational phase, during which the trained algorithm is executed in order to control the system.

For safety reasons, the learning phase is generally carried out under test conditions with dedicated test systems in a controlled environment.

The learning algorithm developed during the test phase is then distributed to each user in order to be executed on each specific system.

For example, in the case of autonomous vehicles, learning is carried out on test vehicles in a secure environment. The learning software is then downloaded onto each vehicle in operational condition in order to be used.

A disadvantage of this method is that it does not take into account the specific features of each vehicle and the differences relative to the test vehicle. In particular, the physical features of a vehicle can evolve over time, for example, because a tire deflates or some sensors or motors degrade. A learning algorithm optimized for certain test conditions therefore is not necessarily adapted to an actual operational situation, which can lead to trajectory errors in actual conditions.

Therefore, a requirement exists for improving the learning systems that are based on machine learning algorithms in order to better take into account the actual operational situations, in particular the evolution of the features of the system.

One solution for improving machine learning involves carrying out the learning on vehicles in operational conditions; however, this raises serious safety issues and therefore cannot be contemplated.

Another solution involves updating the learning carried out under test conditions on the basis of local features of the vehicle on which the autopilot software is installed. Reference is then made to local over-learning.

However, this solution does not actually allow learning to be improved because it does not take into account the fact that the reactions of the vehicle with respect to its environment are dependent on its physical features. For example, if a wheel of the vehicle is slightly deflated, the reaction of the vehicle when facing an obstacle can be different from what it would be with a perfectly inflated wheel.

The existing solutions do not allow the local features of a vehicle and the relationship between these features and the behavior of the vehicle with respect to a given external situation to be precisely taken into account.

SUMMARY OF THE INVENTION

The aim of the present invention is to propose a learning cyber-physical system that combines conventional offline learning with simulated learning from data acquired directly by the system. Thus, the algorithm for controlling the system can be updated regularly on the basis of new situations with which the system (or similar systems cooperating together) is confronted and/or taking into account the evolution of the physical features of the system.

The aim of the invention is a learning device intended to be included in a mobile cyber-physical system provided with actuators, the device comprising at least one perception sensor for perceiving the external environment of the system, at least one internal sensor able to provide information concerning the state of the system, a first learning unit configured to render a perception of the environment from the data acquired by the at least one perception sensor, a second learning unit configured to control the actuators, a generator for generating simulation scenarios of the system in its environment controlled by the first learning unit and the second learning unit, a scenario simulator and a virtualization platform for simulating the behavior of a digital twin of the system in the scenarios simulated by the generator and for adapting the parameters of the second learning unit in order to control the system so that it adapts to its environment, the second learning unit implementing a machine learning algorithm for controlling the actuators from the at least one perception sensor, the at least one internal sensor, with the machine learning algorithm being trained by means of the simulation scenarios simulated in the virtualization platform, the device comprising a component for triggering the simulation scenarios generator as a function of a predetermined type of event detected by the first learning unit, the predetermined event being triggered by a user or by a monitoring algorithm able to detect an event, the device being characterized in that the simulation scenarios generator is configured to generate, on command of the triggering component, a simulation scenario of the environment of the system within a time window before the event is triggered, wherein the behavior of the cyber-physical system is simulated by means of a digital twin of the cyber-physical system from an initial model of the system and from information provided by the at least one internal sensor, in the simulation scenario generated by the generator, and in that the virtualization platform is configured to interact with the second learning unit that updates the parameters of the machine learning algorithm so as to modify the behavior of the cyber-physical system in said generated simulation scenario so as to no longer reproduce said triggering event in said simulation scenario.

According to a particular aspect of the invention, the second learning unit checks that said updated parameters are compatible with a set of initial scenarios not related to said triggering event, in which case the second learning unit updates the machine learning algorithm by a new learning process using said updated parameters.

According to a particular aspect of the invention, the cyber-physical system is an autonomous vehicle, a robot or a drone.

According to a particular aspect of the invention, the at least one perception sensor is taken from among a camera, a Lidar, a laser, an acoustic sensor.

According to a particular aspect of the invention, the at least one internal sensor is taken from among a temperature sensor, a pressure sensor, a speed sensor.

According to a particular aspect of the invention, the first learning unit implements a machine learning algorithm configured to generate characteristic data of the environment from the at least one perception sensor.

According to a particular aspect of the invention, the device comprises a data storage unit for saving the data generated by the first learning unit over a predetermined duration.

According to a particular aspect of the invention, the simulation scenarios generator and/or the simulator and/or the virtualization platform are able to be remote, in a centralized server.

According to a particular aspect of the invention, the virtualization platform is able to receive simulation scenarios generated by remote cyber-physical systems belonging to a pool of systems.

According to a particular aspect of the invention, the device further comprises a component for converting a simulation scenario into a textual semantic description intended to be transmitted to other systems belonging to the same pool and a component for generating a simulation scenario from a received textual semantic description.

A further aim of the invention is a mobile cyber-physical system provided with actuators comprising a learning device according to the invention configured to control the actuators for controlling said system in its environment.

BRIEF DESCRIPTION OF THE DRAWINGS

Further features and advantages of the present invention will become more apparent upon reading the following description with reference to the following appended drawings, in which.

DETAILED DESCRIPTION

Figure 1:
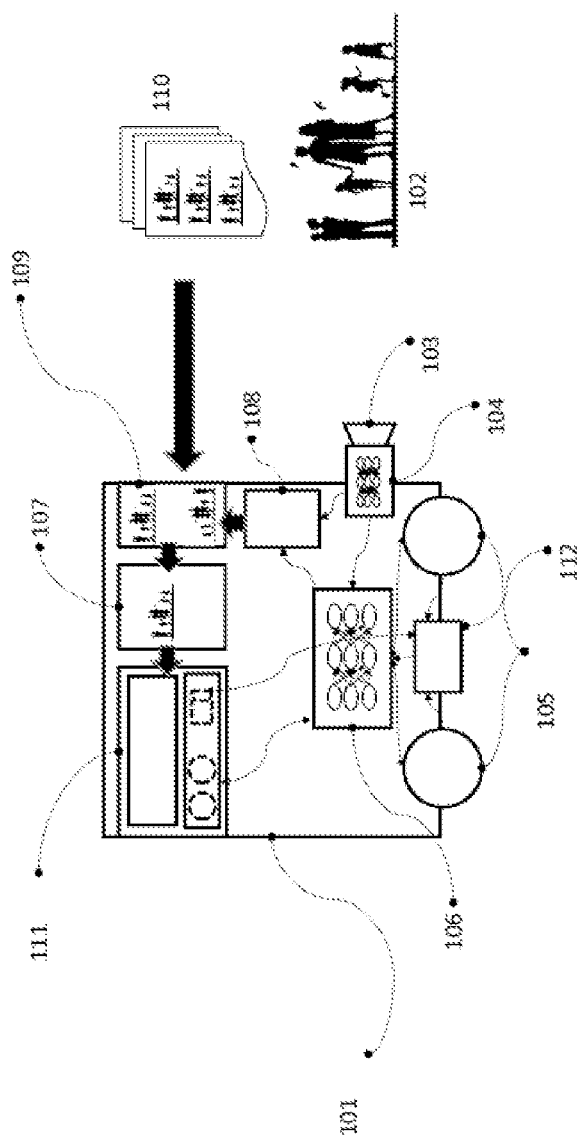
FIG. 1 shows a diagram of a first alternative embodiment of a cyber physical system according to the invention.

FIG. 1 illustrates, on a diagram, an example of a cyber-physical system according to the invention comprising a learning device.

The system 101 is movable in an environment 102. For example, the system 101 is a motor vehicle traveling on a road, or a robot or even a drone.

The system 101 moves in its environment by means of actuators 105. The actuators designate all the elements of the system that allow it to move or even to interact with its environment. For example, if the system 101 is a vehicle, the actuators 105 notably include the wheels, the steering wheel, the gear shifter. If the system 101 is a robot, the actuators 105 also include an articulated arm of the robot for grasping an object.

In general, the actuators 105 are controlled by a command (for example, an electric signal) in order to interact with the environment 102.

The system 101 is provided with a learning device that comprises the following elements.

One or more external sensors 103 are arranged on the system 101 for acquiring perception data or measurements of the environment 102. In other words, the external sensors or perception sensors 103 comprise, for example, a camera, a Lidar device, a laser, an acoustic sensor or any other sensor allowing information to be measured concerning the environment 102.

The one or more external sensors 103 is/are connected to a first learning unit 104, the function of which is to convert the raw data acquired by the sensors 103 into perception information of the environment that can be used to reconstruct the environment 102.

For example, if the data provided by the sensors 103 are images, the function of the learning unit 104 is to detect and characterize objects in the acquired images, in particular obstacles such as pedestrians or buildings or even to detect the boundaries of a road.

To this end, the learning unit 104 implements a machine learning algorithm, for example, an algorithm based on an artificial neural network.

A second learning unit 106 is used to control the actuators 105 as a function, notably, of the data supplied by the first learning unit 104 to characterize the environment.

The second learning unit 106 implements another machine learning algorithm, the function of which is to control the actuators 105 so that the system 101 correctly interacts with its environment 102.

For example, if the system 101 is a vehicle, an aim of the second learning unit 106 is to control the movement of the vehicle in its environment by avoiding collisions with obstacles and by complying with the highway code. If the system 101 is a robot, an aim of the second learning unit 106 is to control the movement of the robot and to control its articulated arm to complete a predetermined mission.

As introduced in the preamble, the one or more learning algorithms implemented by the second learning unit 106 is/are previously trained to achieve the intended aim based on learning data in a test environment. The training is notably carried out by means of scenarios 110 for simulating the environment 102 that allow the unit 106 to be trained to carry out the intended aim for a set of predetermined scenarios.

An aim of the invention notably is to improve the learning carried out by the unit 106 in order to more precisely take into account the evolution of the environment 102, but also the evolution of the features of the system 101 over time.

To this end, the system 101 is also provided with internal sensors 112, the role of which is to measure features relating to the state of the system 101, in particular the state of the actuators 105. For example, the internal sensors 112 comprise temperature sensors, pressure sensors, notably for the pressure of the tires of a vehicle, speed sensors.

The measurements provided by the internal sensors 112 are also taken into account in the learning of the second learning unit 106 for controlling the actuators 105.

Moreover, the data generated by the first learning unit 104 are stored in a memory 108 over a predefined time interval.

The learning device provided on the system 101 also comprises a generator 109 for generating simulation scenarios of the environment 102. This generator is, on the one hand, supplied by a definition of a set of initial predetermined scenarios 110 for training the learning unit 106. On the other hand, it is supplied by the perception data of the environment stored in the memory 108 in order to generate new scenarios from the information acquired by the external sensors 103. Optionally, the generation of scenarios also takes into account the information provided by the learning unit 106.

The generator 109 is activated following a triggering event. This event can be triggered manually by a user of the system 101, for example, by the driver of a vehicle wishing to update the learning of the unit 106 following a particular event, for example, a collision of the system with an obstacle. The generator 109 also can be triggered automatically by means of a machine learning algorithm configured to detect a particular event, for example, a collision or non-compliance with the highway code or even noncompliance of a mission entrusted to a robot, or even unacceptable performance of the robot for the completed task, for example, an excessive execution time. The detection of this event can be carried out by the first learning unit 104.

Following the triggering event, the generator 109 generates a new scenario of the environment 102 from the data stored in the memory 108 and corresponding to a predefined time interval before the triggering event. This new scenario is provided at the input of a simulator 107 able to simulate the system 101 in its simulated environment corresponding to the generated scenario.

A virtualization platform 111 is then used to simulate the overall behavior of the system 101, including the parameterization of the learning unit 106. The virtualization platform 111 is able to model a digital twin of the system 101 from an initial model of the system and from measurements provided by the internal sensors 112. Thus, the digital twin allows the system 101 and its changes over time to be faithfully reproduced and allows these changes to be taken into account when the learning unit 106 learns to control the system. Notably, the virtualization platform 111 uses the data recorded in the memory 108 over a predefined time interval before the triggering event, comprising the data feedback from the internal sensors, in order to virtually reproduce the scenario that led to the event. The learning algorithm implemented by the learning unit 106 re-configures the actuators of the system 101 so as to virtually produce an acceptable scenario in the same simulated environment.

More specifically, the virtualization platform 111 simulates the behavior of the digital twin of the system in the scenario simulated by the simulator 107. During this simulation, new learning of the machine learning algorithm executed by the learning unit 106 is implemented for the purpose of controlling the system in order to avoid the incident that triggered the new scenario. For example, if the triggering event corresponds to a collision of the vehicle with an obstacle that has not been detected, the learning algorithm uses the data from the sensors corresponding to a preceding time interval and integrating this collision as learning data in order to modify the parameterization of the trajectory of the vehicle, in order to learn to avoid this type of obstacle. If the triggering event corresponds to the vehicle crossing a line that is incompatible with compliance with the highway code, the learning algorithm uses these new learning data in order to modify the parameterization of the trajectory of the vehicle in order to avoid such line crossing. In general, the data saved in the memory 108 and corresponding to a triggering event are used as new training data for updating the machine learning algorithm so that this type of event no longer occurs in the future or, in other words, so that the system 101 is configured to avoid the occurrence of such an event.

This new learning is carried out for the new simulated scenario, but also for all the initial scenarios 110 in order to always check that the control of the system is compatible with all the expected scenarios. Thus, the new parameterization of the actuators, for example, controlling the transmission in the case where the system is a vehicle for which the triggering event is a poor trajectory due to an under inflated tire, is simulated for all the initial scenarios 110 in order to check that the new learning does not generate other undesirable events. Indeed, modifying the parameterization of an actuator can, potentially, generate other unwanted events within the context of the previously tested scenarios, it is therefore important to execute all the scenarios for each new set of training data available following a triggering event.

Thus, the learning algorithm implemented by the learning unit 106 is executed in the virtualization platform 111 with the simulation parameters in order to implement new learning of this algorithm.

On completion of this learning, the new parameters of the algorithm determined by the virtualization platform 111 are transmitted to the learning unit 106, which will update its learning algorithm in order to modify the control of the system in actual conditions.

The new learning phase carried out by the virtualization platform 111 is, for example, carried out during a period of inactivity of the system 101. It is also possible to carry out the learning phase on the virtualization platform at the same time as the system is operating, and to transfer the improved parameters to the system once it is stopped or in a safe condition.

Thus, if the system 101 encounters a situation similar to the scenario that led to an incident, it will be able to improve its reaction in order to avoid a new incident.

In order to illustrate the operation of the system according to the invention, an example of an application will now be described for the case of an autonomous car.

A triggering event for generating a new scenario is, for example, crossing a line, not adhering to a traffic light or a collision with an obstacle or, more generally, a traffic accident.

Following this event, the generator 109 produces a simulation scenario corresponding to this accident on the basis of the data recorded in the memory 108. The virtualization platform 111 will then implement new learning of the control algorithm on the basis of this scenario with the aim of modifying the control of the vehicle in order to avoid the accident. The new parameters of the artificial intelligence algorithm executed by the learning unit 106 are then updated so that the vehicle improves its reaction if the scenario that led to the accident recurs. The updated parameters remain compatible with the other previously validated scenarios.

The virtualization platform 111 takes into account, via the simulation of the digital twin of the vehicle, the internal features of the car, for example, the pressure level of the tires or even their state of wear, which can be estimated through a correlation between the time that has elapsed since they were changed and their level of use.

In the case of a robot, learning aims, for example, to improve the handling of an articulated arm of the robot in order to improve its grip for grasping certain types of objects or for executing certain tasks that require precision.

One advantage provided by the invention is that it allows the learning of the learning unit responsible for controlling the system to be improved as a function of events that occur in operational conditions. In particular, the invention makes it possible to react to one-off events that have not been anticipated in the initial training scenarios used to develop the learning algorithm.

Moreover, unlike the solutions based on "offline" learning, by means of test vehicles, the invention takes into account, by means of a digital twin of the system, the evolution of the state of the system over time.

The learning unit 106 responsible for controlling the system 101 executes one or more machine learning algorithms that receive as input all the data acquired by the external 103 and internal 112 sensors, as well as the perception data of the environment produced by the first learning unit 104 and that produces as output one or more commands for the actuators 105.

The algorithms implemented by the unit 106 can be selected from among the algorithms of the prior art that are known to a person skilled in the art. Without being exhaustive, several possible examples of such algorithms are cited. Reference [1] describes a parking assistance algorithm for a vehicle. Reference [2] describes a method for detecting known types of events that can be used to detect a particular event and to trigger the generation of a new scenario. Reference [3] describes an algorithm for adapting the control of a vehicle in real time. Reference [4] describes an artificial intelligence algorithm for adapting the control of a vehicle in a modelled terrain. Reference [5] describes an artificial intelligence algorithm for adapting the generation of trajectories of mobile robots. Reference [6] also describes another example of a learning algorithm for autonomous driving.

The first learning unit 104 also executes one or more machine learning algorithms, the aim of which is to characterize the environment of the system from the data acquired by the external sensors 103.

The algorithms implemented by the unit 104 can be selected from among the algorithms of the prior art that are known to a person skilled in the art. Without being exhaustive, several possible examples of such algorithms are cited.

Reference [7] describes an algorithm for detecting particular events in a video sequence.

Reference [9] describes a detection method for measurements acquired by environment sensors.

Reference [10] describes a method for detecting pedestrians in a video sequence.

Reference [11] describes another method for detecting objects in images.

Reference [13] describes a method for characterizing a 3D scene.

Reference [14] describes a method for recognizing objects in a scene observed in 3D.

Furthermore, reference [8] describes a method for generating a simulated environment that can be implemented by the generator 109.

Reference [12] describes a system for generating a simulated scenario from data supplied by sensors that also can be used to produce the generator 109.

Each component of the learning device according to the invention taken individually or in combination with another can be produced, for example, by means of an on-board processor. The processor can be a generic processor, a specific processor, an Application Specific Integrated Circuit (also known as ASIC) or a Field-Programmable Gate Array (also known as FPGA). The learning device according to the invention can use one or more dedicated electronic circuits or a general-purpose circuit. The technique of the invention can be carried out on a reprogrammable computing machine (a processor or a microcontroller, for example) executing a program comprising a sequence of instructions, or on a dedicated computing machine (for example, a set of logic gates, such as an FPGA or an ASIC, or any other hardware module, in particular neuromorphic electronic modules suitable for onboard learning).

FIG. 1 describes a first alternative embodiment of the invention whereby all the components of the learning device are included in the cyber-physical system 101.

Figure 2:
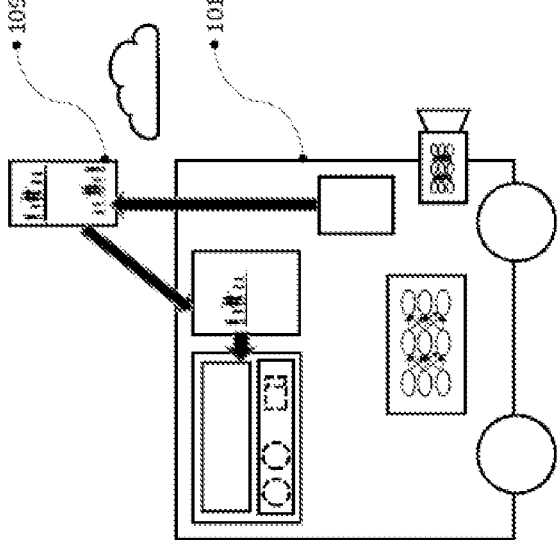
FIG. 2 shows a second alternative embodiment of the system of FIG. 1.

FIG. 2 describes a second alternative embodiment of the invention whereby the simulation scenarios generator 109 is remote, outside the system 101, for example, in a remote server.

Figure 3:
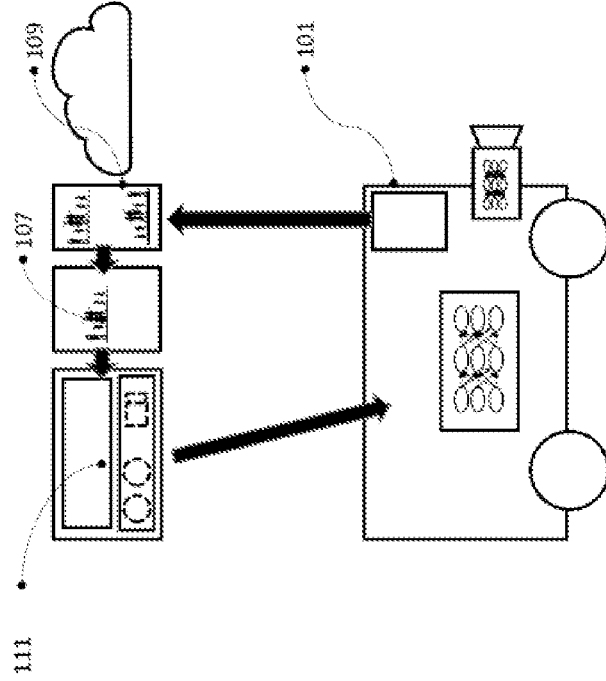
FIG. 3 shows a third alternative embodiment of the system of FIG. 1.

FIG. 3 describes a third alternative embodiment of the invention whereby the simulation scenarios generator 109, the simulator 107 and the virtualization platform 111 are remote, in a remote server.

Figure 4:
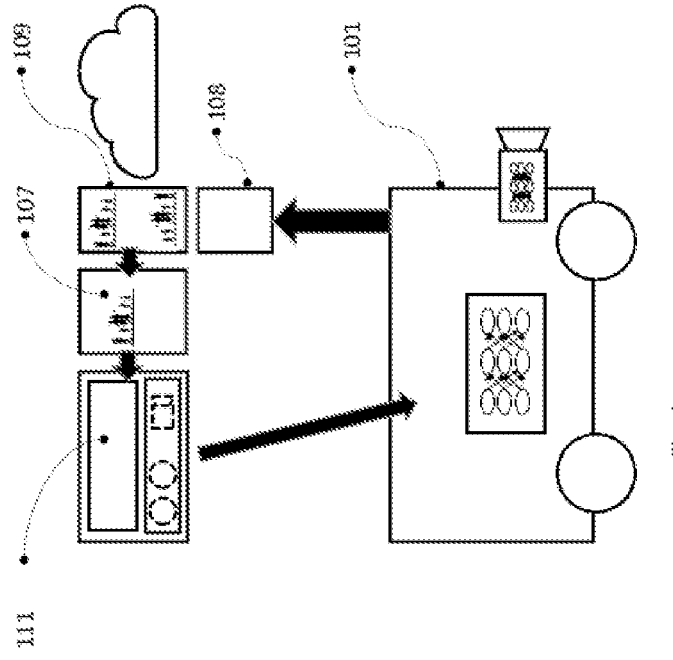
FIG. 4 shows a fourth alternative embodiment of the system of FIG. 1.

FIG. 4 describes a fourth alternative embodiment of the invention whereby, in addition, the storage or memory unit 108 for saving the perception data over a time period is also remote, in a remote server.

Without departing from the scope of the invention, each of the components 109, 107, 111, 108 can be remote, alone or in combination with another, from a computing server with augmented computing resources. These various alternative embodiments require that the system 101 comprises communication equipment for exchanging data with the remote server. It can involve, for example, radio communication equipment based on wireless technology (for example, 5G technology).

Figure 5:
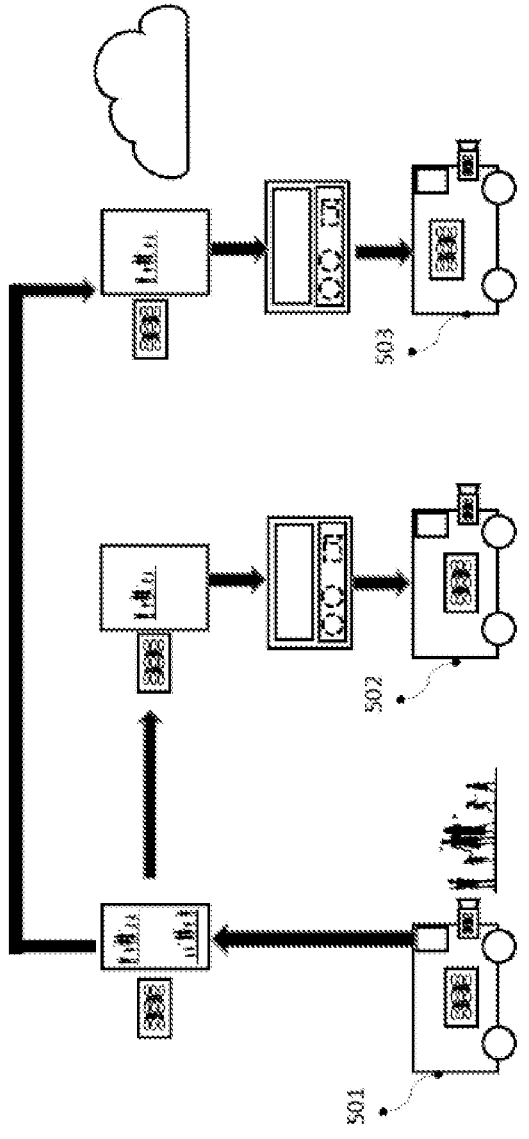
FIG. 5 represents an example of distributed implementation of the system according to the invention.

FIG. 5 describes another embodiment of the invention whereby the simulation scenarios generated following an event are shared between several systems 501, 502, 503 cooperating together within a pool. One advantage of this alternative embodiment is that it allows cooperative learning, with all the vehicles benefiting from the new scenarios generated by each vehicle following an event, and leading to an acceleration of the overall security level of the pool.

More specifically, in this embodiment, the new scenarios generated by any one of the systems (the system 501 in the example of FIG. 5) are retransmitted to all the other systems 502, 503 of the pool so that they implement new learning.

In another alternative embodiment of the system described in FIG. 5, the simulation scenarios are transmitted to the other vehicles of the pool in a compressed form, for example, in the form of a semantic description. In this way, the bandwidth consumed by these data transfers is decreased.

More specifically, the system 501 that generates a new scenario, also generates a semantic description of this scenario. For example, a semantic description can be obtained using semantic image algorithms that create a textual description from an image. The textual description of the generated scenario is then transmitted to the other systems 502, 503 of the pool that can re-generate the simulation scenarios from this textual description using a text-based scene-generating algorithm.

Reference [15] provides an example of a method for generating a semantic description from images.

Reference [16] provides an example of a method for generating a scene from a semantic description (ontology).

This alternative embodiment has a significant advantage for limiting the amount of data exchanged between the systems of the pool in order to share the scenarios.

REFERENCES

[1] European patent application EP 3152097.
[2] European patent application EP 3198523.
[3] A. Hill, E. Lucet, R. Lenain, 'Neuroevolution with CMA-ES for real-time gain tuning of a car-like robot controller', proc. 16th Int. Conf. on Informatics in Control, Automation and Robotics, 29-31 Jul. 2019, Prague, Czech Republic, 9 pages.
[4] E. Lucet, R. Lenain, C. Grand, 'Dynamic path tracking control of a vehicle on slippery terrain', Control Engineering Practice, 42, September 2015, pp. 60-73.
[5] M. A. Rahmouni, E. Lucet, R. Bearee, A. Olabi, M. Grossard, 'Robot trajectory generation for three-dimensional flexible load transfer', proc. 45th Annual Conf. of the IEEE Industrial Electronics Society, 14-17 Oct. 2019, Lisbon, Portugal, pp. 711-716.
[6] A. Amini et al., "Learning Robust Control Policies for End-to-End Autonomous Driving From Data-Driven Simulation," in *IEEE Robotics and Automation Letters*, vol. 5, no. 2, pp. 1143-1150, April 2020, doi: 10.1109/LRA.2020.2966414.
[7] P. C. Ribeiro, R. Audigier, Q. C. Pham, 'RIMOC, a feature to discriminate unstructured motions: Application to violence detection for video-surveillance', Computer Vision and Image Understanding, 144, March 2016, pp. 121-143.
[8] D. Larnaout, V. Gay-Bellile, S. Bourgeois, M. Dhome, 'Fast and automatic city-scale environment modelling using hard and/or weak constrained bundle adjustments', Machine Vision and Applications, 27(6), August 2016, pp. 943-962.
[9] G. Vaquette, C. Achard, L. Lucat, 'Robust information fusion in the DOHT paradigm for real time action detection', Journal of Real-Time Image Processing, online December 2016, 14 p.
[10] T. Chesnais, T. Chateau, N. Allezard, Y. Dhome, B. Meden, M. Tamaazousti, A. Chan-Hon-Tong, 'A Region Driven and Contextualized Pedestrian Detector', proc. 8th Int. Conf. on Computer Vision Theory and Application, 21-24 Feb. 2013, Barcelona, Spain, pp. 796-799.
[11] F. Chabot, M. Chaouch, J. Rabarisoa, C. Teuliere, T. Chateau, 'Deep MANTA: A Coarse-to-fine Many-Task Network for joint 2D and 3D vehicle analysis from monocular image', proc. IEEE Conf. on Computer Vision and Pattern Recognition, 21-26 Jul. 2017, Honolulu, Hawaii, USA, pp. 1827-1836.
[12] International application WO 2018/011497.
[13] European patent application EP 3384462.
[14] French patent application FR 3076028.
[15] "A hierarchical approach for generating descriptive image paragraphs", J. Krause et al. Stanford University, 10 Apr. 2017.
[16] "Ontology based scene creation for the development of automated vehicles", G. Bagschik et al., Institute of control engineering, 23 Apr. 2018.

The invention claimed is:

1. A learning device intended to be included in a mobile cyber-physical system provided with actuators, the device comprising at least one perception sensor for perceiving the external environment of the system, at least one internal sensor able to provide information concerning the state of the system, a first learning unit configured to render a perception of the environment from the data acquired by the at least one perception sensor, a second learning unit configured to control the actuators, a generator for generating simulation scenarios of the system in its environment controlled by the first learning unit and the second learning unit, a scenario simulator and a virtualization platform for simulating the behavior of a digital twin of the system in the scenarios simulated by the generator and for adapting the parameters of the second learning unit in order to control the system so that it adapts to its environment, the second learning unit implementing a machine learning algorithm for controlling the actuators from the at least one perception sensor, the at least one internal sensor, with the machine learning algorithm being trained by means of the simulation scenarios simulated in the virtualization platform, the device comprising a component for triggering the simulation scenarios generator as a function of a predetermined type of event detected by the first learning unit, the predetermined event being triggered by a user or by a monitoring algorithm able to detect an event, the device comprising the simulation scenarios generator is configured to generate, on command of the triggering component, a simulation scenario of the environment of the system within a time window before the event is triggered, wherein the behavior of the cyber-physical system is simulated by means of a digital twin of the cyber-physical system from an initial model of the system and from information provided by the at least one internal sensor, in the simulation scenario generated by the generator, and in that the virtualization platform is configured to interact with the second learning unit that updates the parameters of the machine learning algorithm so as to modify the behavior of the cyber-physical system in said generated simulation scenario so as to no longer reproduce said triggering event in said simulation scenario.

2. The learning device as claimed in claim 1, wherein the second learning unit checks that said updated parameters are compatible with a set of initial scenarios not related to said triggering event, in which case the second learning unit updates the machine learning algorithm by a new learning process using said updated parameters.

3. The device as claimed in claim 1, wherein the cyber-physical system is an autonomous vehicle, a robot or a drone.

4. The device as claimed in claim 1, wherein the at least one perception sensor is taken from among a camera, a Lidar, a laser, an acoustic sensor.

5. The device as claimed in claim 1, wherein the at least one internal sensor is taken from among a temperature sensor, a pressure sensor, a speed sensor.

6. The device as claimed in claim 1, wherein the first learning unit implements a machine learning algorithm configured to generate characteristic data of the environment from the at least one perception sensor.

7. The device as claimed in claim 1, comprising a data storage unit for saving the data generated by the first learning unit over a predetermined duration.

8. The device as claimed in claim 1, wherein the simulation scenarios generator and/or the simulator and/or the virtualization platform are able to be remote, in a centralized server.

9. The device as claimed in claim 1, wherein the virtualization platform is able to receive simulation scenarios generated by remote cyber-physical systems belonging to a pool of systems.

10. The device as claimed in claim 9, further comprising a component for converting a simulation scenario into a textual semantic description intended to be transmitted to other systems belonging to the same pool and a component for generating a simulation scenario from a received textual semantic description.

11. A mobile cyber-physical system provided with actuators comprising a learning device as claimed in claim 1 configured to control the actuators for controlling said system in its environment.

\* \* \* \* \*